United States Patent
Akre et al.

(10) Patent No.: US 10,063,149 B2
(45) Date of Patent: Aug. 28, 2018

(54) MULTI-PHASE SWITCHING POWER CONVERTER MODULE STACK

(71) Applicant: Apple Inc., Cupertino, CA (US)

(72) Inventors: Sunil M. Akre, Santa Clara, CA (US); Suresh B. Kariyadan, San Jose, CA (US); Vincent W. Trimeloni, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/631,811

(22) Filed: Jun. 23, 2017

(65) Prior Publication Data

US 2018/0145594 A1    May 24, 2018

Related U.S. Application Data

(60) Provisional application No. 62/426,120, filed on Nov. 23, 2016.

(51) Int. Cl.
*H02M 3/158* (2006.01)
*H02M 1/084* (2006.01)
*H03K 7/08* (2006.01)

(52) U.S. Cl.
CPC ......... *H02M 3/1584* (2013.01); *H02M 1/084* (2013.01); *H03K 7/08* (2013.01); *H02M 2003/1586* (2013.01)

(58) Field of Classification Search
CPC ........ H02M 3/1584; H02M 2003/1586; H02K 7/08
See application file for complete search history.

(56) References Cited

U.S. PATENT DOCUMENTS

| | | | |
|---|---|---|---|
| 5,847,951 A | * | 12/1998 | Brown .................. H01L 25/165 363/147 |
| 6,429,632 B1 | | 8/2002 | Forbes et al. |
| 7,863,877 B2 | | 1/2011 | Briere |
| 7,882,482 B2 | | 2/2011 | Ueunten |
| 8,169,088 B2 | | 5/2012 | Nguyen |
| 8,400,778 B2 | | 3/2013 | Hsing |

(Continued)

OTHER PUBLICATIONS

Wens, M., "An 800mW Fully-Integrated 130nm CMOS DC-DC Step-Down Multi-Phase Converter, With On-Chip Spiral Inductors and Capacitors", *IEEE*, (Sep. 20-24, 2009), 3706-3709.

(Continued)

*Primary Examiner* — Jue Zhang
(74) *Attorney, Agent, or Firm* — Blank Rome LLP

(57) ABSTRACT

A module stack includes a lower module, a middle module above the lower module, and an upper module above the middle module. The lower module has power stage control circuitry configured to convert a PWM input signal into phase driver control signals, and power stages to be controlled by the phase driver control signals, respectively. The middle module has phase inductors each having a respective winding and a respective magnetic core. The respective winding has one end joined to a respective one of the power stages in the lower module and another end joined to a common node in the middle module. The upper module has a current sense resistor that has one end joined to the common node in the middle module and another end joined to an output node in the upper module. Other embodiments are also described and claimed.

23 Claims, 12 Drawing Sheets

(56) References Cited

U.S. PATENT DOCUMENTS

| | | | |
|---|---|---|---|
| 8,401,594 B2 | 3/2013 | Zhang et al. | |
| 8,570,007 B2 | 10/2013 | Schiff et al. | |
| 8,619,449 B2* | 12/2013 | Chiba | H01L 23/50 363/147 |
| 8,811,247 B2 | 8/2014 | Thomson et al. | |
| 2005/0024908 A1* | 2/2005 | Gizara | H02M 3/00 363/147 |
| 2008/0304306 A1* | 12/2008 | Chang | H01L 25/16 363/147 |
| 2009/0251119 A1* | 10/2009 | Stojcic | H01L 23/49513 323/282 |
| 2010/0246459 A1 | 9/2010 | Ding et al. | |
| 2012/0181996 A1* | 7/2012 | Gehrke | H01L 23/49524 323/271 |
| 2016/0081019 A1 | 3/2016 | Pujari et al. | |
| 2016/0270003 A1 | 9/2016 | Sun et al. | |

OTHER PUBLICATIONS

"Assembly Guidelines for QFN (Quad Flat No-lead) and DFN (Dual Flat No-lead) Packages", *Freescale Semiconductor, Inc.*, (Oct. 1, 2014), 1-33.

"NEC TOKIN Develops New Magnetic Material Senfoliage that can be Installed on Printed Circuit Board", *News Release*, (Jul. 21, 2015), 1 page.

"PWM Doubler with Phase Shedding Function and Output Monitoring Feature", *Intersil*, (Feb. 4, 2010), 1-15.

Boettcher, Lars, et al., "Embedding of Chips for System in Package realization—Technology and Applications", *2008 3rd International Microsystems, Packaging, Assembly & Circuits Technology Conference. IEEE*, (Oct. 22-24, 2008), 7 pages.

Chen, Qiaoliang, et al., "Design Considerations for Passive Substrate with Ferrite Materials Embedded in Printed Circuit Board (PCB)", *IEEE*, (Jun. 17-21, 2007), 1043-1047.

Finco, Saulo, et al., "A Smart Power Integrated Circuit Educational Tool", *IEEE Transactions on Power Electronics*, vol. 22, No. 4, (Jul. 1, 2007), 1290-1302.

Fuketa, Hiroshi, et al., "On-Chip Buck Converter with Spiral Ferrite Inductor and Reducing IR Drop in 3D Stacked Integration", *The 2014 International Power Electronics Conference*, (May 18-21, 2014), 2228-2231.

Hasan, Ayaz, "Design of Monolithic Step-Up DC-DC Converters with On-Chip Inductors", *A Thesis presented to the University of Guelph*, (Aug. 1, 2011), 116 pages.

Hou, Dongbin, et al., "Improving the Efficiency and Dynamics of 3D Integrated PoL", *IEEE*, (Mar. 15-19, 2015), 140-145.

Kudva, Sudhir S., et al., "Fully-Integrated On-Chip DC-DC Converter With a 450X Output Range", *IEEE Journal of Solid-State Circuits*, vol. 46, No. 8, (Aug. 1, 2011), 1940-1951.

Morrison, David, "PSMA Studies Supply-in-Package and Supply-on-Chip Trends", *Power Electronics*, Retrieved from the Internet: <http://powerelectronics.com>, (Nov. 14, 2007), 4 pages.

Musunuri, Surya, et al., "Design Issues for Monolithic DC-DC Converters", *IEEE Transactions on Power Electronics*, vol. 20, No. 3, (May 1, 2005), 639-649.

Sun, Jian, et al., "Fully monolithic cellular buck converter design for 3-D power delivery", *IEEE Transactions on Very Large Scale Integration (Vlsi) Systems*, vol. 17, No. 3, (Mar. 1, 2009), 447-451.

Vidwans, Amogh V., "High Efficiency Monolithic DC-DC Converters", *Indo-German Winter Academy*, 2009, (Jan. 1, 2009), 33 pages.

* cited by examiner

MULTI-PHASE SWITCHING POWER CONVERTER MODULE STACK

This application claims the benefits of the earlier filing date of U.S. Provisional Patent Application No. 62/426,120, filed Nov. 23, 2016.

FIELD

An embodiment of the invention is a module stack for a multi-phase, dc-dc switching power converter in which power stage control circuitry, power stages, phase inductors and a current sense resistor are arranged into three, stacked modules. Other embodiments are also described and claimed.

BACKGROUND

A multi-phase, switch mode power supply (SMPS) power converter is particularly suitable as a voltage regulating power supply for space-constrained applications in which greater power density and conversion efficiency are desired. These desirable output characteristics invoke the use of high permeability magnetic materials in the phase inductors as well as techniques for miniaturization of the inductors and the overall packaging of the power converter. A typical dc-dc power converter includes the following components: an SMPS controller that implements for example a buck conversion topology to also achieve voltage regulation at an output node, power stage control circuitry that converts a pulse width modulation (PWM) signal from the SMPS controller into two or more phase driver control signals each of which is input to a respective phase driver circuit, a number of power stages each to be controlled by the outputs of a respective phase driver circuit, a number of phase inductors, an output filter capacitor, a current sense resistor to measure load current of the converter, and voltage feedback paths from the sense resistor back to the power stage control circuitry. It is a difficult problem to design such a power converter to have a certain output power rating and to also fit within a specified volume of space.

SUMMARY

A first embodiment of the invention is a module stack that may become a part of a multi-phase switching power converter, e.g., a dc voltage regulator, which exhibits a compact profile from various directions, making it particularly suitable for space-constrained applications. The module stack includes a lower module, a middle module above the lower module, and an upper module above the middle module. The lower module has power stage control circuitry configured to convert a pulse width modulated (PWM) input signal into a number of phase driver input signals. The lower module also has therein a number of power stages to be controlled by the phase driver input signals, respectively. The middle module has a number of phase inductors each having a respective winding and a respective magnetic core, wherein the respective winding has one end joined to a respective one of the power stages in the lower module and another end joined to a common node in the middle module. The upper module has a current sense resistor that has one end joined to the common node in the middle module and another end joined to an output node in the upper module. Such an arrangement yields a desirable side profile and a desirable printed circuit board (PCB) footprint at the lower module, with a further benefit of forming the current sense resistor in a metal layer of the upper module that may also effectively act as a heat sink for the phase inductors and power stages that are below it.

In a second embodiment, the current sense resistor that is in the upper module of the first embodiment (and is used to sense the load current) is absent, while the lower module may be as in the first embodiment. The middle module (also referred to now as the upper module) still has the phase inductors therein wherein the respective winding of each of the phase inductors has one end joined to a respective one of the power stages in the lower module. However, the other end of the respective winding (of each of the phase inductors) is now joined to a converter output that is in the same module as the phase inductors. In such an embodiment, current sensing (for use by the driver control circuitry when controlling the phase driver input signals to balance the currents in the phase inductors) may be achieved on a per-phase basis, by using the "on-resistance" of the switches that make up the power stages. To sense these on-resistances, a number of feedback voltage signals are routed through respective conductive paths that are formed solely in the lower module and that join the power stages to the driver control circuitry (without extending into the upper module). Such an arrangement yields a shorter side profile for the overall structure (due to the absence of an upper layer in which a current sense resistance is formed), as well a desirable PCB footprint at the lower module.

The lower module may include an integrated circuit surface mount package, a chip carrier or a printed circuit board (PCB), in which the power stage control circuitry may be realized, that has a number of external electrical connections formed on a bottom surface of the lower module and that are joined to i) a high side supply input and a low side return or ground in the lower module, and ii) the converter output in the upper module.

In a third embodiment, output power is combined after, or "downstream" of, individual phase current sense resistors that are formed in the upper module. Here, the lower module may be as in the first embodiment, and the middle module still has the phase inductors therein, wherein the respective winding of each of the phase inductors has one end joined to a respective one of the power stages in the lower module. However, the other end of the respective winding is now joined to a respective inductor lower portion that is in the same module as the phase inductors. In the case of a two-phase module stack, there is an inductor 1 lower portion that is joined to an inductor 1 upper portion in the upper module, and an inductor 2 lower portion that is joined to an inductor 2 upper portion in the upper module. Also, multiple (e.g., two) phase current sense resistors are formed in the upper module each having i) one end joined to the respective one of the inductor lower portions in the middle module (through the respective one of the inductor upper portions in the upper module) and ii) another end joined to an output node in the upper module. In this way, the output power from multiple phases may be combined in the upper module, downstream of the phase current sense resistors.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1A:
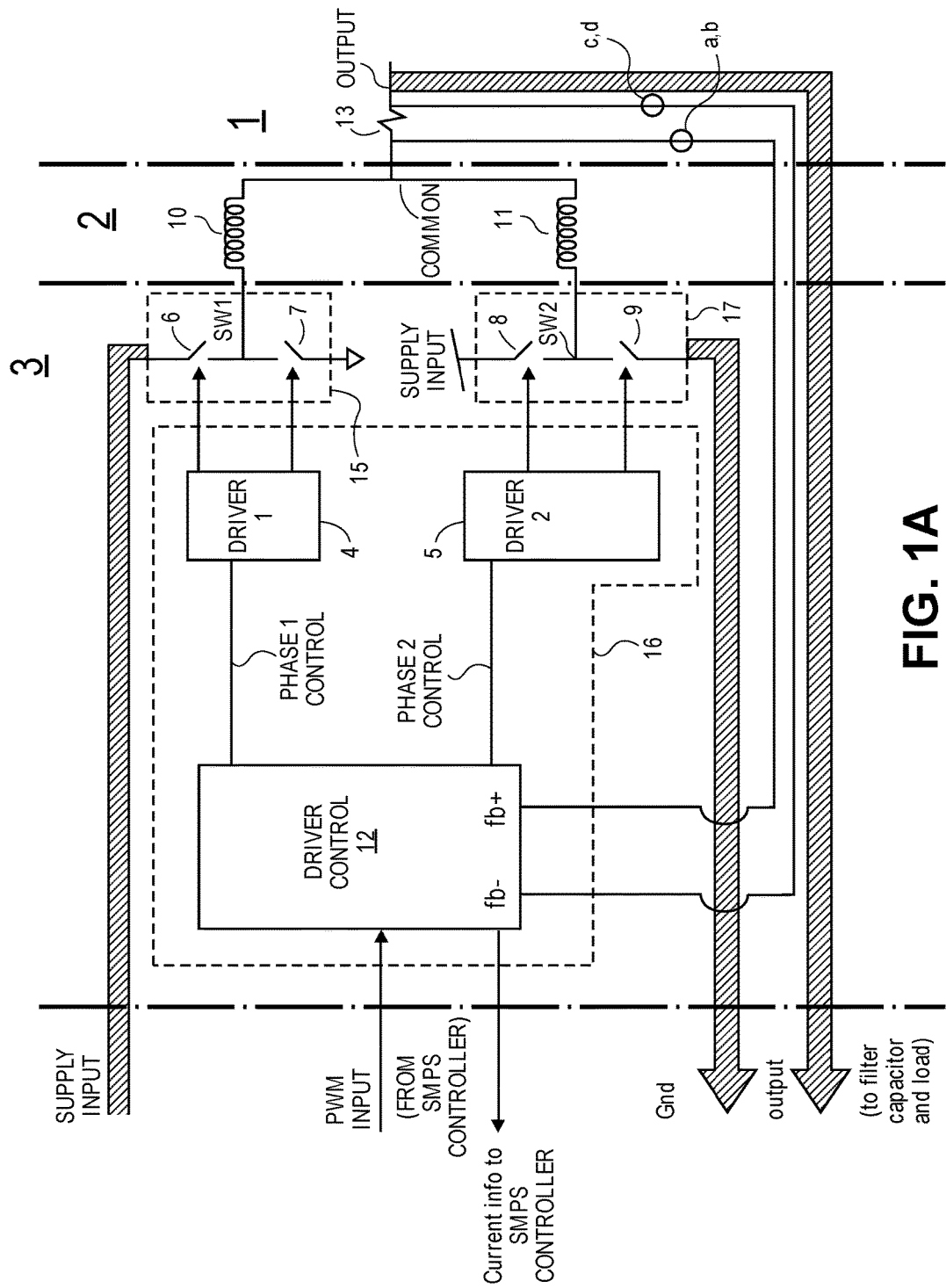
FIG. 1A is a circuit schematic illustrating part of a multi-phase switching power converter that can be arranged into a module stack having the lower, middle and upper modules, and wherein output power is combined before, or "upstream" of, an output current sense element.

FIG. 1A is a circuit schematic illustrating part of a multi-phase, switch mode power supply (SMPS) or switching, power converter. The converter has an output node as shown that is coupled to a filter capacitor (now shown) and to a load (not shown). Driver control circuitry 12 (as part of power stage control circuitry 16) is configured to convert a single pulse width modulated (PWM) input signal into at least two phase driver control signals (in this example only two, namely phase 1 control and phase 2 control). In addition, the driver control circuitry 12 has inputs fb+ and fb− through which it may process current sensing signals through terminals a, b, c, d as described below, into current information (current feedback) and then communicates this information back to the SMPS controller as shown. In one embodiment, the converter has at least two phases, and the driver control circuitry 12 can convert the single PWM input signal into identical or 180 degree phase shifted PWM waveforms (of the two phase driver control signals, phase 1 control and phase 2 control) that can be at the same frequency as the PWM input or one half of it. In other embodiments, the converter has more than two phases, such that the single PWM signal is converted into a corresponding number (more than two) in-phase or out of phase PWM signals. Also, the term "PWM" is used broadly here to also encompass other SMPS modulation modes or time ratio control, including pulse frequency modulation, pulse density modulation, and mixed or hybrid modulation.

A phase 1 inductor 10 and a phase 2 inductor 11 are coupled to a "common" node at their far ends, while the near ends are coupled to node sw1 of a phase 1 power stage 15 and node sw2 of a phase 2 power stage 17, respectively, as shown. In other words, in such an embodiment, all of the phase inductors (there may be more than two) are tied to a common node or common terminal. The phase 1 power stage 15 has a high side 1 switch 6 and a low side 1 switch 7 coupled as shown to a high side supply input and a low side return or ground, respectively. The phase 2 power stage 17 has a similar arrangement, where a high side 2 switch 8 and a low side 2 switch 9 are coupled as shown to the high side supply input and the low side return or ground, respectively. The phase driver control signals produced by the driver control circuitry 12 are translated by phase 1 driver 4 and phase 2 driver 5, respectively, into signals that can be applied directly to the control electrodes of transistors, e.g., field effect transistors, FETs, that constitute the high side and low side switches. In this example, the phase driver control signals are translated by the phase 1 driver 4 and the phase 2 driver 5 into pairs of high side switch and low side switch control signals that in turn directly open and close their respective switches 6-9. The phase 1 driver 4 and the phase 2 driver 5 may also be configured to protect the power FETs, that make up the high side and low side switches, against any desired combination of overload, short circuit, over temperature, input over-voltage, and input under-voltage conditions.

The PWM-based switching of the phase 1 power stage 15 and the phase 2 power stage 17 results in a controlled transfer of power (current) from the supply input, through the two phases, to the "output" node. In the example shown, the converter has a step down or buck-type conversion topology that may be configured to regulate the output node voltage, while delivering power to the load from the supply input that is at a different voltage (higher than the output node voltage). A SMPS controller (not shown) produces the PWM input signal to achieve the controlled power transfer, based on voltage feedback from the output node of the converter that represents a load voltage, and optionally current feedback obtained directly from the output node and that represents load current, or indirectly from the driver control circuitry 12 as the latter senses either the total output (or load) current or individual phase currents, for example as described below.

Note that the phase driver control signals (phase 1 control and phase 2 control) may be adjusted by the driver control circuitry 12, based on feedback voltage signals fb+ and fb−, to balance the currents in the two phases (phase 1 inductor 10 and the phase 2 inductor 11), respectively. A combined or sum current of all of the phase inductors (also referred to as total output current here) may be sensed at the driver control circuitry 12 through the use of a current sense resistor 13, described as follow. In one embodiment (as shown), the feedback voltage signals fb+ and fb− are taken from the two terminals of the current sense resistor 13 that has one end or terminal joined to the common node and another end or terminal joined to the output node as shown. Based on a stored resistance value representing the resistance of the current sense resistor 13, a difference between fb+ and fb− is sensed by the driver control circuitry 12 to determine a measure of the load current through the resistor 13. Additional information may be available to the driver control circuitry 12, e.g., stored inductance values representing the inductance of the phase 1 inductor and that of the phase 2 inductor, and knowledge of which phase is presently "firing" at the moment the current is being sensed, and other individual phase information that is communicated from each of the phase 1 driver 4 and phase 2 driver 5, to the driver control circuitry 12, that enables the latter to adjust duty cycle or pulse width of the phase 1 control and phase 2 control driver signals, to force a balance between the two phase currents. For example, the driver control circuitry 12 may use the sensed total output current and any individual current information, to achieve current balancing amongst the phases.

Another approach to balancing the phase currents may be to route the feedback voltage signals fb+ and fb− from the phase 1 power stage 15, providing a measure of the voltage across the high side 1 switch 6 or across the low side 1 switch 7, which can be used together with a stored resistance value representing the on-resistance of the switch to compute the inductor current of the phase 1 inductor 10. A similar arrangement, using an additional pair of fb+, fb− inputs that are routed to the high side or low side switch in the phase 2 power stage 17, enables the computation of the inductor current of the phase 2 inductor 11.

Still referring to FIG. 1A, in accordance with an embodiment of the invention, this portion of the power converter is manufactured as a single module stack. The vertical dashed lines in FIG. 1A may translate to the horizontal planes that mark the boundaries of at least three modules including a lower module 3, a middle module 2 that is above the lower module 3, and an upper module 1 that is above the middle module—see the side view of the module stack in FIG. 1B. The modules are joined to each other to form a single stack as shown. The lower module 3 has external connections as shown that are exposed on a bottom surface thereof and that are to be soldered to a printed circuit board (PCB)—not shown. The external connections may conduct the following: the PWM input signal, processed load current information (sourced from or to the SMPS controller); the low side return or ground; the high side supply input; and the output. In one embodiment, to complete the power converter, the module stack is assembled in combination with the PCB, where the latter has pads to which the external electrical connections of the lower module 3 are soldered. There is also an output filter capacitor (not shown) having a terminal that is soldered to a pad in the PCB, wherein a metal trace in the PCB joins the pad to one of the pads to which an external electrical connection of the lower module 3 is soldered that is joined to the output node through the lower module 3. This provides a particularly desirable packaging solution for the power converter, in space-constrained applications.

To ease understanding of the written description here in relation to the drawings, the following should be noted. The terms "upper" and "lower" or "above" and "below" are used to describe portions of a node or element in a vertical direction or along the z-axis. For example and referring to FIG. 1B to illustrate this, a node or element may have a height or thickness defined by the combination of its upper portion joined to its lower portion; the upper portion may be part of the upper module 1, while the lower portion may be part of the middle module 2; in another instance, the upper portion may be at the top surface of the middle module 2, while the lower portion is also in the middle module 2 but of course below the upper portion).

Figure 1B:
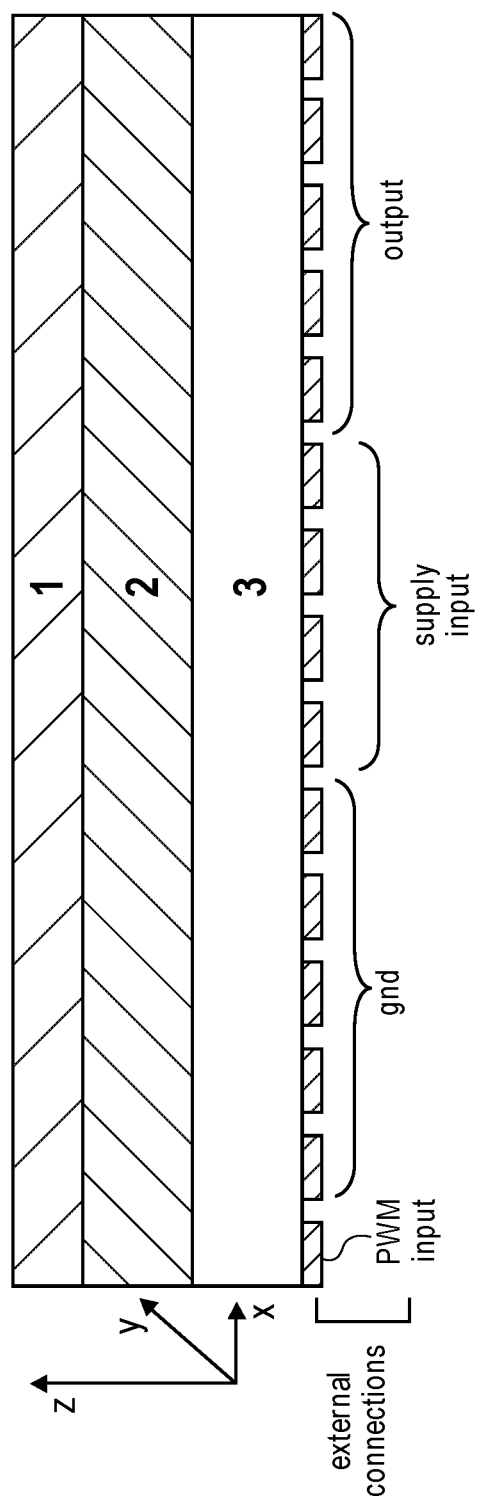
FIG. 1B is a side view of the module stack.

The terms "front" and "rear", or "ahead" and "behind", refer to horizontal positions that are along the y-axis, and the terms "left" and "right" refer to horizontal positions that are along the x-axis—again, see FIG. 1B to illustrate this using an example. A conductive path or node or other element may have a lateral or sideways "spread" that may be defined by its front portion joined to its rear portion, and/or by its left portion joined to its right portion. In most instances here, the front, rear, left and right portions of an element are said to be in the same module.

Figure 2:
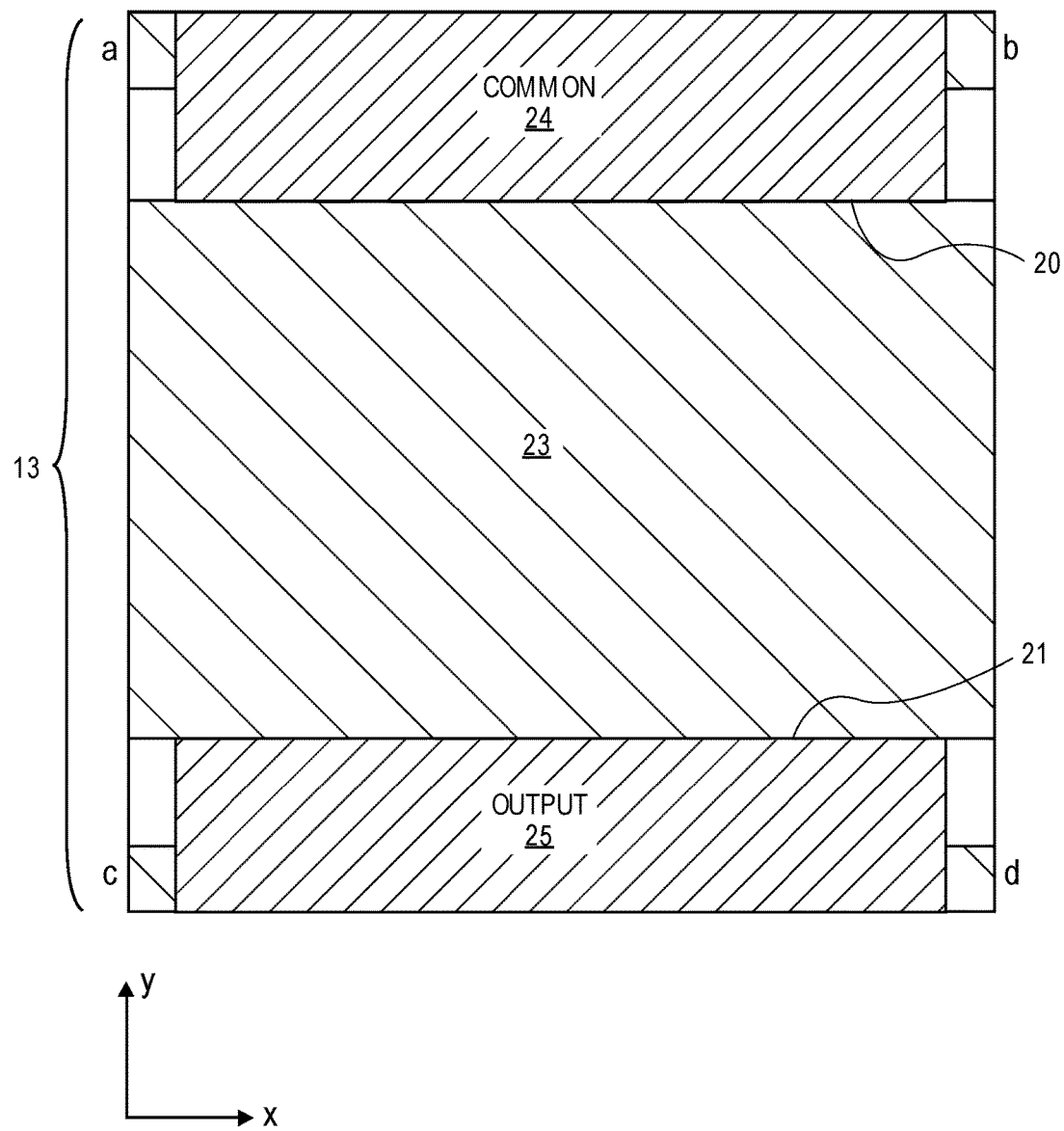
FIG. 2 depicts an example layout of some of the conductive nodes in the upper module of a module stack having the output current sense arrangement of FIG. 1A.

Referring now to FIG. 2, this figure depicts an example layout of the conductive paths in the upper module 1. The conductive paths shown may be within the same horizontal or x-y plane (e.g., part of a single horizontal metal layer) in the upper module 1, where they form the current sense resistor 13 and parts of the common and output nodes—see FIG. 1A. The current sense resistor 13 may be formed in a metal layer that has been patterned to have a sense resistor body portion 23 having a front side boundary 20 and a rear side boundary 21. These are joined to a common node upper portion 24 that is at the front boundary of the upper module 1, and to an output node upper portion 25 that is at the rear boundary of the upper module 1, as shown. The conductivity, thickness, shape and size of the sense resistor body portion 23 and its interface with portions 24, 25 may be designed to yield a known resistance between sense terminals a, b at one end and sense terminals c, d at another end, for the purpose of current sensing. For example, as depicted in the drawing, the sense resistor body portion 23 may be of a different material than the common node upper portion 24 and the output node upper portion 25; alternatively, the sense resistor body portion 23 may be formed in the same metal layer and of the same material as the common node upper portion 24 and the output node upper portion 25. In one embodiment, the upper module 1 has a single metal layer in which the current sense resistor 13 is formed as shown, and above which there is no electronic circuitry that can reduce the heat sink abilities of the top metal layer in the upper module 1—see FIG. 1B. This helps the upper module 1 perform as a heat sink for the entire module stack.

Figure 3:
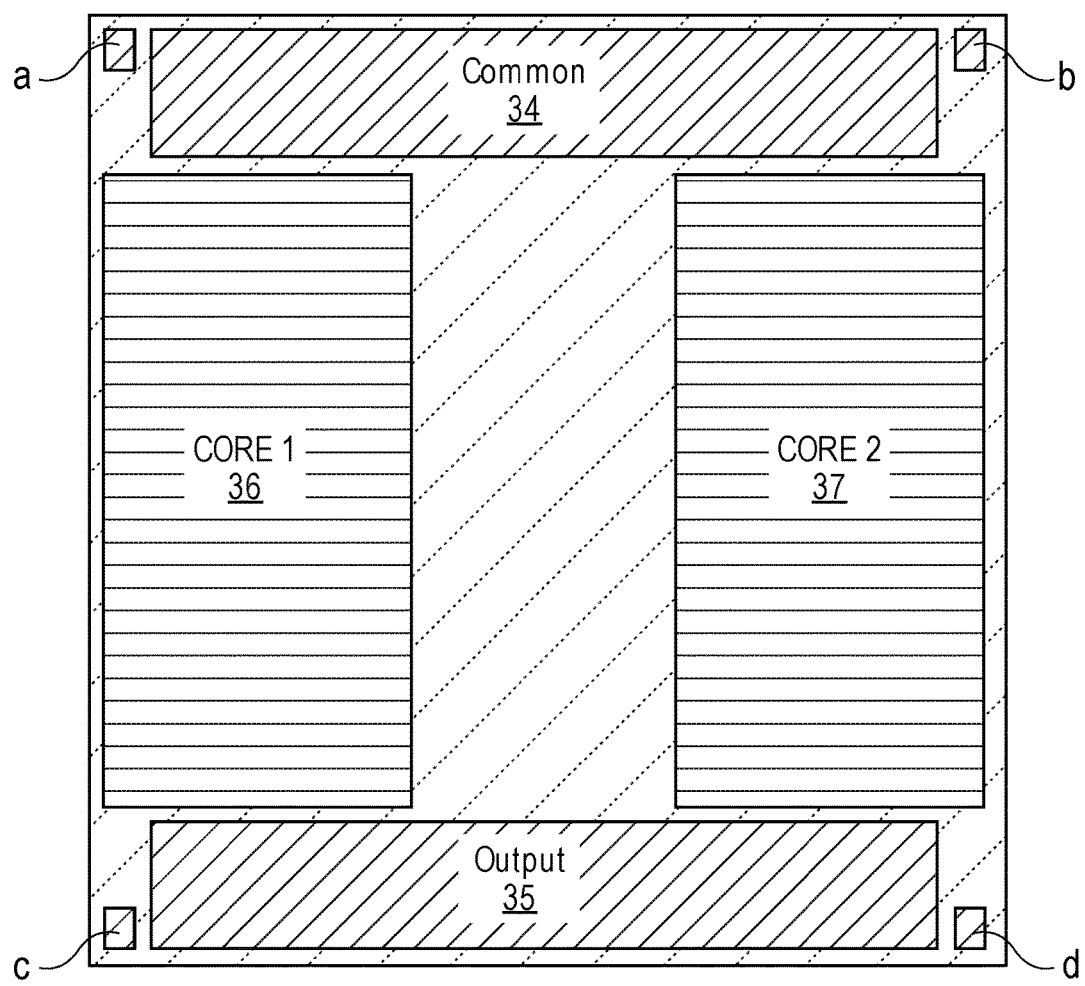
FIG. 3 depicts an example layout of some of the conductive portions at a top surface of the middle module, in the case of a module stack having only two phases and the output current sense arrangement of FIG. 1A.

As seen in FIG. 1A, the common node extends across the boundary between the middle module 2 and the upper module 1, as follows. As shown in FIG. 2, it has a common node upper portion 24 that lies in the upper module 1, and, as seen in FIG. 3, it also has a common node lower portion 34 that is at the top surface of the middle module 2. The common node also has a common node further lower portion 44 that is in the middle module 2 (below its top surface)—see FIG. 4.

As seen in FIG. 1A, the output node extends across the boundary of modules 1, 2 and across the boundary of modules 2, 3, all the way to the bottom surface of module 3. It has an output node upper portion 25 that lies in the upper module 1, as seen in FIG. 2, and an output node middle portion 35 that is in the top surface of the middle module 2 as shown in FIG. 3. The output node also has an output node further middle portion 45 that is in the middle module 2 (below the top surface)—see FIG. 4. The output node also has an output node lower portion 65 that is in top surface of the lower module 3—see FIG. 6—and that is joined to an output node further lower portion 75 that may be exposed at the bottom surface of the lower module 3—see FIG. 7.

Referring briefly to FIG. 1A, the current sensing in this embodiment may be performed by the driver control circuitry 12 through a voltage sensed at fb+, fb− which nodes are coupled as shown across the resistor 13, at sense terminals a, b and c, d, respectively. The sense terminals a, b have upper portions that as shown in FIG. 2 that are joined to the common node upper portion 24, while the sense terminals c, d have their upper portions joined to the output node upper portion 25, as shown. It should be noted that while a pair of sense terminals are shown at each end of the resistor 13 in FIG. 2, corresponding to a pair of paths coupling each end of the resistor 13 to its respective fb+, fb− input (see FIG. 1A), an alternative is to have a single path coupling each end of the resistor 13 to the fb+ or fb− input, provided it has sufficiently low resistance for current sensing purposes. In these instances, it can be seen that the feedback voltage signals are being routed through several conductive paths, respectively, that are joined to the common node and to the output node in the upper module, and that extend downward through the middle module and into the lower module where they join the power stage control circuitry 16.

Figure 4:
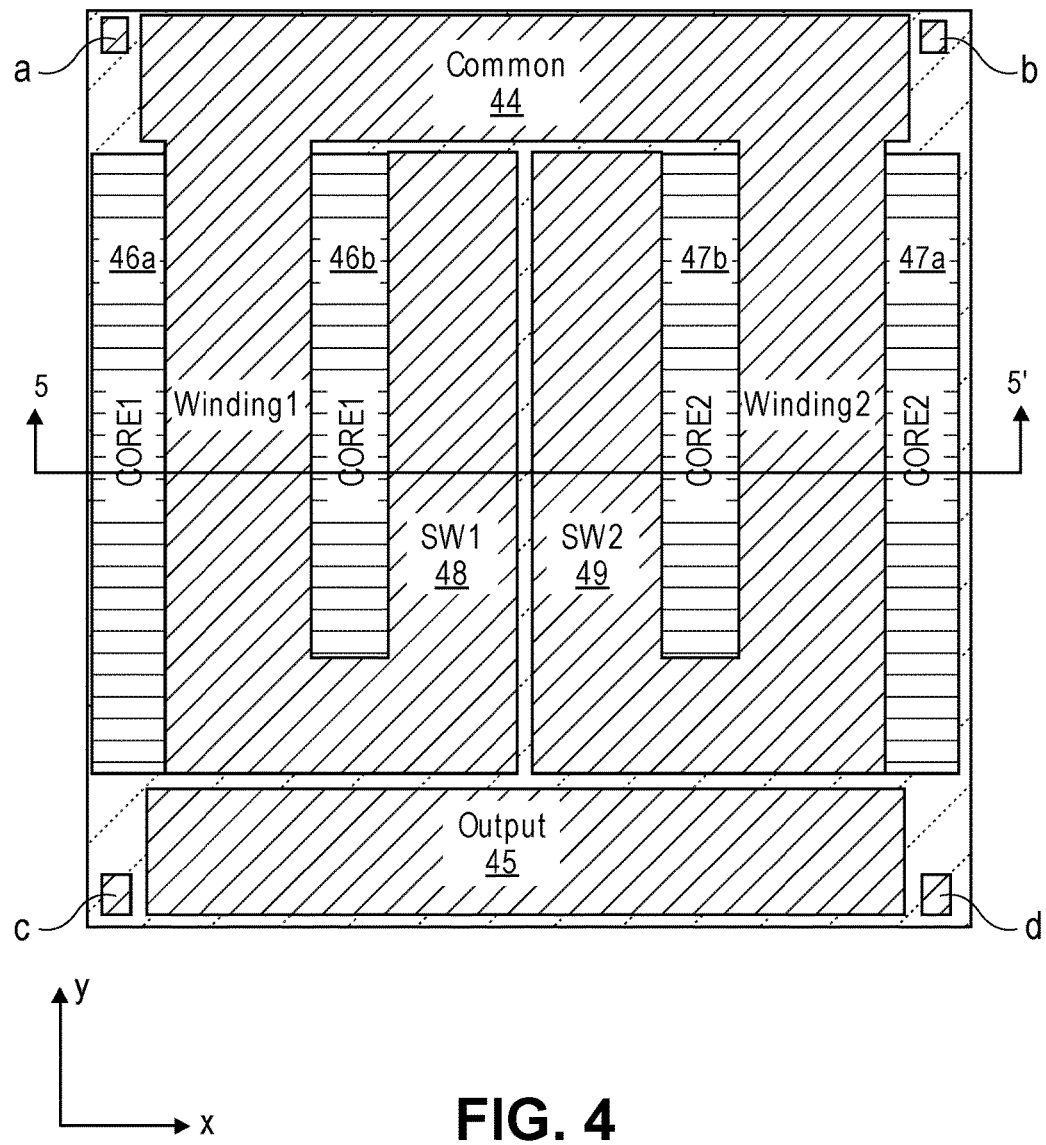
FIG. 4 depicts an example layout for the magnetic cores and windings of phase inductors in the two-phase middle module of FIG. 3.
Figure 5:
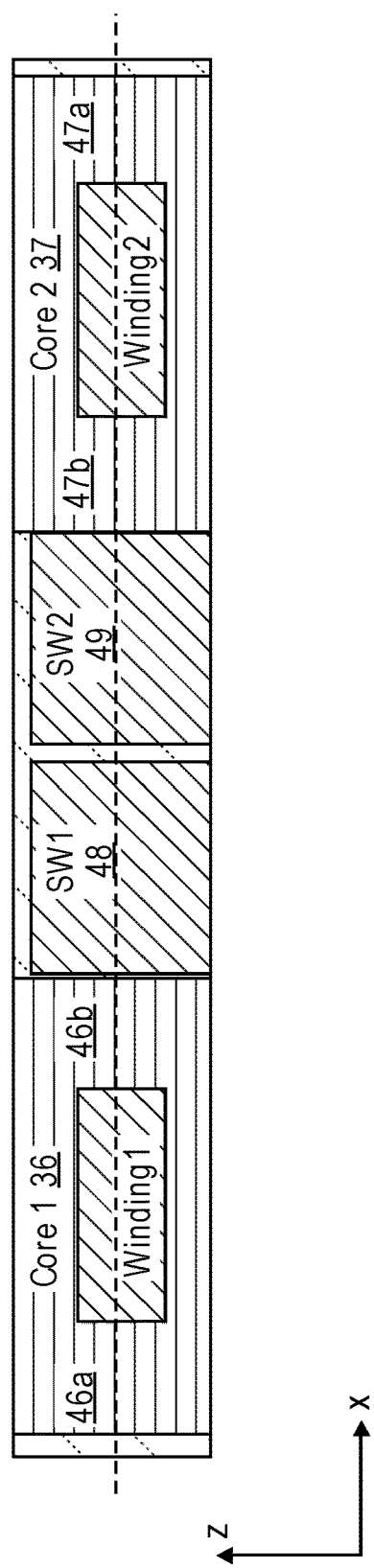
FIG. 5 depicts a cross-section of the magnetic cores and windings of FIG. 4.

FIGS. 3-5 illustrate different views of an example of the middle module 2. In one embodiment, the middle module 2 is a printed circuit board in which the respective magnetic core of each of the phase inductors are formed as described below, as embedded magnetics. In another embodiment, the respective magnetic core of each of the phase inductors is a laminated magnetic core, and the respective winding is formed as metal laminations. In yet another embodiment, the respective magnetic core of each of the phase inductors is formed of Nano-magnetic material.

FIG. 3 shows a top metal layer (a top surface) of the middle module 2 that has been patterned, as follows. Referring also to FIG. 2, the common node upper portion 24 that forms part of the common node in FIG. 2 joins a common node lower portion 34 that is formed in the middle module 2 and that aligns directly below the upper portion 24, as seen in FIG. 3. Similarly, the output node upper portion 25 that forms part of the output node in the upper module 1 joins the output node middle portion 35 in the middle module 2.

FIG. 3 also shows four middle portions at the four corners of the middle module 2, respectively, that align directly below and join their corresponding upper portions in the upper module 1—see FIG. 2. These define in part the sense terminals a, b and c, d—see FIG. 1A.

Still referring to FIG. 3, also formed in the middle module 2 are core1 upper portion 36 and core2 upper portion 37, of the two magnetic cores, core1 and core2, respectively, which are parts of the phase 1 inductor 10 and phase 2 inductor 11, respectively—see FIG. 1A. This is for the case of a module stack having only two phases (thus two magnetic cores and two windings), which is the example depicted in FIG. 1A. As seen in that figure, the middle module 2 contains the phase inductors 10, 11 each being formed of a respective winding and a respective magnetic core. A winding1 of the phase 1 inductor 10 has one end that is joined to node sw1 of the phase 1 power stage 15 (in the lower module 3), and another end joined to the common node in the middle module 2. Similarly, the phase 2 inductor 10 has a winding2 that has one end joined to node sw2 of the phase 2 power stage 17, and another end joined to the common node in the middle module 2. FIG. 4 shows a layout for elements of the two inductors, in a horizontal plane that may be cut through the middle (height-wise) of the middle module 2, below the top surface depicted in FIG. 3. This layout exhibits left-right symmetry across a vertical axis that lies in between a node sw1 upper portion 48 and a node sw2 upper portion 49.

The following elements are visible in FIG. 4:

an output node further middle portion 45 is at the rear boundary, while the common node further lower portion 44 is at the front;

winding1 has one end which joins the common node further lower portion 44 of the common node, and then extends rearward and then sideways to the right along the output node further middle portion 45 and around a core1 lower inner portion 46*b*, where it joins the node sw1 upper portion 48;

winding2 has an arrangement that mirrors that of winding1—it has one end which also joins the common node further lower portion 44, and then extends rearward and then sideways to the left along the output node further middle portion 45 and around a core 2 lower inner portion 47*b*, where it joins the node sw2 upper portion 49;

a core1 lower outer portion 46*a* of core1 is at the left boundary of the middle module 2, and a core2 lower outer portion 47*a* is at the right boundary (of the middle module 2);

the core1 lower inner portion 46*b* is immediately surrounded by the winding1 on the left side, the node sw1 upper portion 48 on the right side, and the common node further middle portion 44 in front; and the core2 lower inner portion 47*b* is immediately surrounded by the winding2 on the right side, the node sw2 upper portion 49 on the left side, and the common node further middle portion 44 in front.

Also visible in FIG. 4 are middle portions of the four sense terminals a, b, c, d at the four corners of the middle module 2, respectively, which continue the downward paths that define in part the sense terminals a, b and c, d—see FIG. 1A.

FIG. 5 is a section taken along line 5-5' in FIG. 4, showing how in this view, the winding1 is immediately surrounded by core1, and in particular by its upper portion 36 above, its lower outer portion 46*a* on the left and its lower inner portion 46*b* on the right. Similarly, winding2 is immediately surrounded by core2, and in particular by its upper portion 37 above, its lower outer portion 47*a* to the right and its lower inner portion 47*b* to the left.

Also in FIG. 5, note how the node sw1 upper portion 48 and the node sw2 upper portion 49 extend downward to the bottom surface of the middle module 2 as shown. The left-right symmetry mentioned above in relation to FIG. 4 is also apparent here in FIG. 5, across the vertical axis that runs in between the node sw1 upper portion 48 and the node sw2 upper portion 49.

Figure 6:
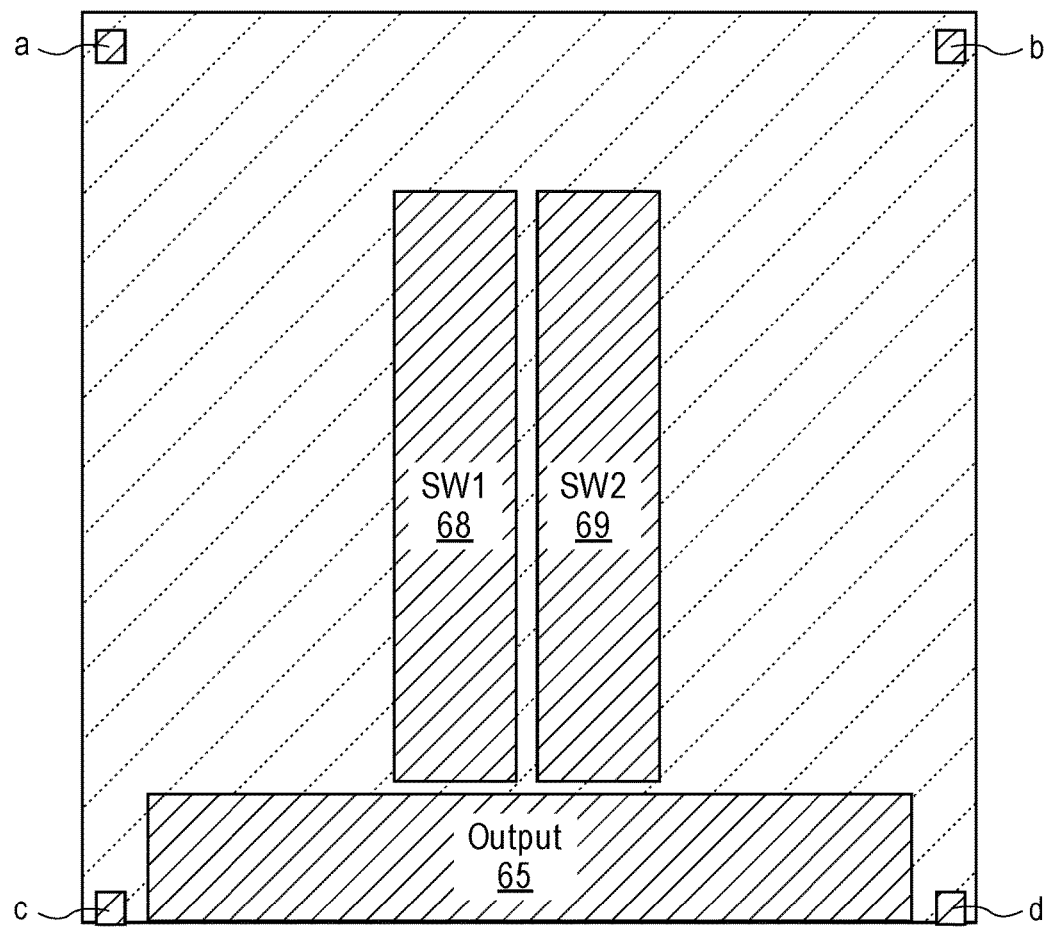
FIG. 6 shows a top view of the top surface of the lower module that joins the middle module of FIG. 3 and FIG. 4.

FIG. 6 shows a top view of the top surface of the lower module 3 that joins the middle module 2 (in FIG. 4 and FIG. 5). Note how the node sw1 upper portion 48 (FIG. 4) is joined to and is aligned directly above a node sw1 lower portion 68; similarly, the node sw2 upper portion 49 (FIG. 4) is joined to and is aligned directly above a node sw2 lower portion 69. Also, the output node further middle portion 45 (FIG. 4) is joined to and is aligned directly above an output node lower portion 65. The latter is at the rear boundary of the lower module 3, behind the node sw1 portions 68, 69. The "empty" regions to the left, right and front of the node sw1 lower portion 68 and the node sw2 lower portion 69 may be used to contain the power stages 15, 17, the drivers 4, 5, and the driver control circuitry 12 (see FIG. 1A). Also visible in FIG. 6 are the lower portions of the sense terminals a, b, c, d, at the four corners of the lower module 3, respectively, that align directly below their respective upper portions in the middle module 2 (as seen in FIG. 3 and FIG. 4) and in the upper module 1 (as seen in FIG. 2), as part of the paths that define the sense terminals a, b and c, d.

Figure 7:
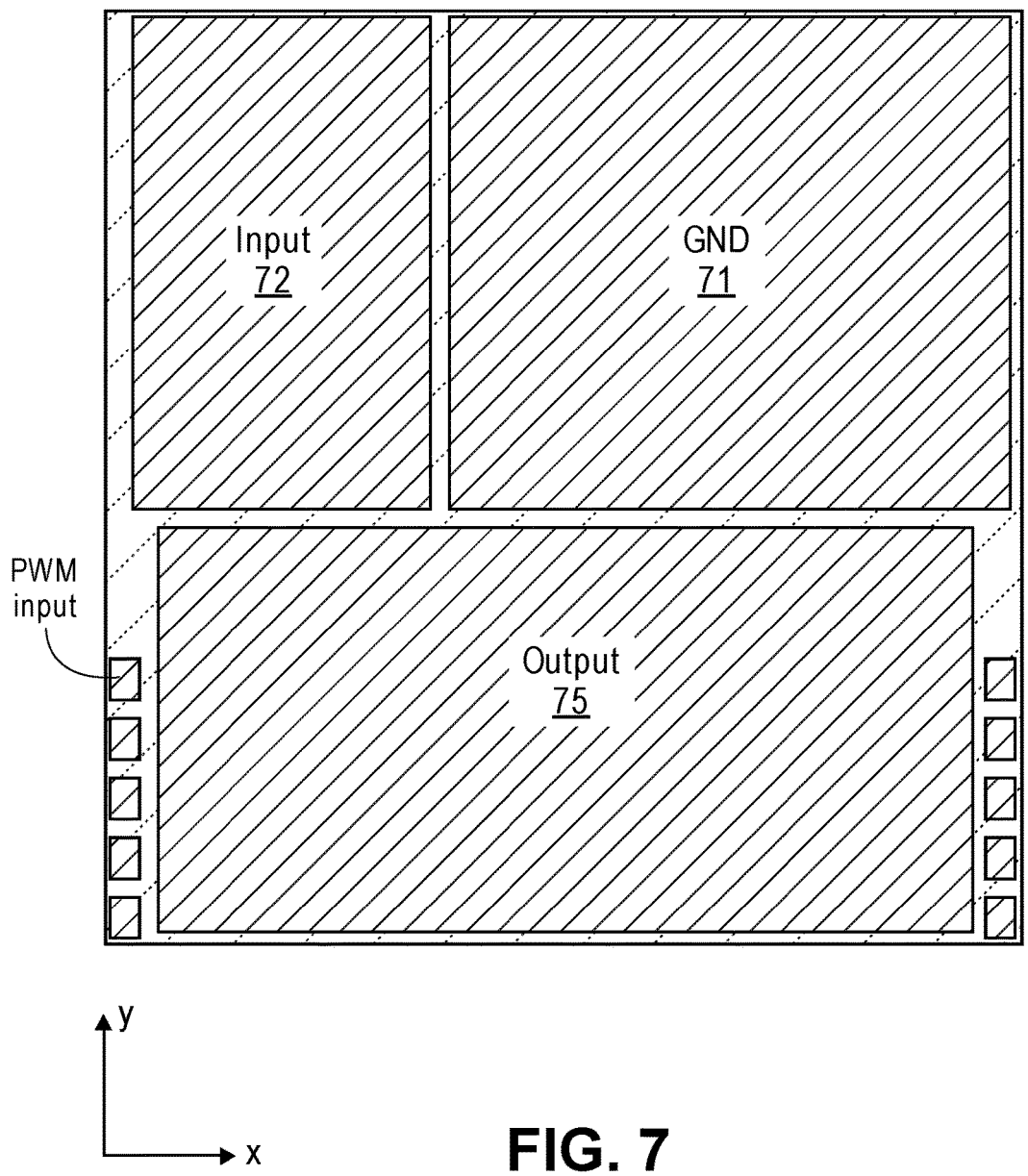
FIG. 7 depicts a view of the bottom surface the lower module, in which an example layout of some of the conductive nodes can be seen.

FIG. 7 depicts a view of the bottom surface the lower module 3, in which an example layout of some of the conductive regions (nodes) can be seen. The nodes may be the external connections depicted in FIG. 1A, exposed on the bottom surface of the lower module 3, e.g., to enable solder joints to be made between the external connections and corresponding pads in a printed circuit board (PCB)—not shown. In particular, the layout has several larger conductive regions, e.g., each consisting of a group of numerous smaller connections, to support high currents. These larger regions include: an input portion 72 that serves as the high side supply input (see FIG. 1A) to the power converter; a ground, GND, portion 71 that serves as the low side return or ground (see FIG. 1A); and an output node further lower portion 75 that serves as the output of the power converter. The layout also has several smaller conductive regions, e.g., a handful of external connections, to support low current signals. These may include: the PWM input for the module stack (see FIG. 1A); an enable control signal (e.g., that is input to the driver control circuitry 12, to enable and disable the phase 1 driver and phase 2 driver signals); a fault signal produced by the driver control circuitry 12 that is asserted in the event the latter detects a fault; hand-shaking signals that may be routed to the SMPS controller to establish a digital communications link with the driver control circuitry 12; and any other data or control signals.

In one embodiment, the lower module 3 is an integrated circuit surface mount package or chip carrier selected from the group consisting of a ball grid array, a line grid array, and a flat package (whose external connections are exposed on a bottom surface thereof and that are to be soldered to a printed circuit board).

In one embodiment, the upper module 1 and the middle module 2 are joined to each other along an upper planar, patterned metal layer, and wherein the middle module 2 and the lower module 3 are joined to each other along a lower planar, patterned metal layer.

In another embodiment, each of the lower module 3, the middle module 2, and the upper module 1 comprises a metal laminate structure, wherein a metal path is defined for the output node in the laminate structures, that joins and extends from a portion formed in the upper module 1, through the middle module 2, to a portion formed in the lower module 3.

Some additional variations to the above-described aspects of the module stack are possible. For instance, in the example of FIG. 1A, the feedback voltage signals at the fb+, fb− inputs of the driver control circuitry 12 are routed through sense terminals a, b, c, d from the lower module 3 upward through the middle module 2 and into the upper module 1 where they join the current sense resistor 13. An alternative to that approach of using a separate current sense resistor is to use the "on-resistance" of the switches that make up the power stages 15, 17. In that case, the feedback voltage signals at the fb+fb− inputs may be routed through conductive paths, respectively, that are formed solely in the lower module 3 and that join the transistor switches of the power stages 15, 17 to the fb+, fb− inputs. The upper module 1 including the current sense resistor 13 therein may in that case be omitted, such as in the embodiment described next.

In accordance with another embodiment of the invention, the module stack includes a lower module and an upper module, wherein the upper module is directly above the lower module and integrated therewith in the module stack. This would be similar to FIG. 1A except the upper module 1 is absent, such that the middle module 2 is now the "upper module" of the stack. The lower module 3 has the power stage control circuitry 16 as described above, configured to convert the PWM input signal into two or more phase driver signals, and at least the two power stages 15, 17 that are coupled to the high side supply input and the low side return or ground. The power stages are controlled by the phase driver signals, respectively, as described above. In this embodiment, the upper module has the phase inductors 10, 11 each having a respective winding and a respective magnetic core, wherein the respective winding of each of the phase inductors has one end joined to a respective one of the power stages in the lower module and another end joined to a common node in the upper module. The lower module 3 may include an integrated circuit surface mount package, chip carrier or PCB having formed on a bottom surface of the lower module a number of external electrical connections. These external connections include a first group of external electrical connections that are joined to the high side supply input to deliver input power to the converter, a second group of external electrical connections that are joined to the low side return or ground in the lower module 3, and a third group of external electrical connections that are joined to the common node in the upper module to deliver output power from the converter. This embodiment, referred to here as a two-module stack, has a shorter height (z-axis) than the ones described above in connection with FIG. 1A where a current sense resistor 13 is present in the upper "top" module 1 (resulting in a three-module stack).

Similar to the three module stack, the two module stack (having modules 2, 3 and not module 1) may be assembled onto a further PCB having pads to which the first, second and third groups of the external electrical connections of the lower module are soldered. There may also be an output filter capacitor having a terminal that is soldered to a pad in the further PCB that is joined, via a metal trace in the further PCB, to one of the pads to which an external electrical connection of the third group is soldered that is joined to the common node of the module stack.

Additionally, to complete the power converter, the SMPS controller may be mounted on the further PCB. The SMPS controller may be configured to produce the PWM input signal, wherein the further PCB has a further metal trace therein that is to conduct the PWM input signal and that joins one of the external electrical connections of the lower module of the two-module stack.

In the two module stack, each of the lower module and the upper module may be a multi-layer metal laminate structure, wherein a metal path is formed in the laminate structures as the common node, extending from a portion in the upper module downward to a portion that is patterned in a metal layer at a bottom surface of the lower module, similar to how the output node portions 45, 65, 75 are joined to form a metal path in FIGS. 4, 6, 7.

As was suggested above, in the two-module stack of FIG. 1A where the current sense resistor 13 therein is omitted, the power stage control circuitry is configured to control the phase driver signals based on the feedback voltage signals, to balance currents in the phase inductors, wherein the feedback voltage signals are routed through conductive paths, respectively, formed solely in the lower module 3 and that join the power stages without extending into the upper module.

Similar to the three-module stack described above, the two-module stack may also be implemented such that its upper module and its lower module are joined to each other along a planar, patterned metal layer, wherein the upper module is defined as being above the planar patterned metal layer and the lower module is defined as being below the planar patterned metal layer.

The two-module stack and the three-module stack as described above may be considered to be phase doublers, because they can each convert a single PWM input signal into two, phase driver signals. Either module stack may be replicated to support a power converter that has more than two phases. For example, a six-phase power converter would use three of the phase-doubler module stacks.

Figure 8:
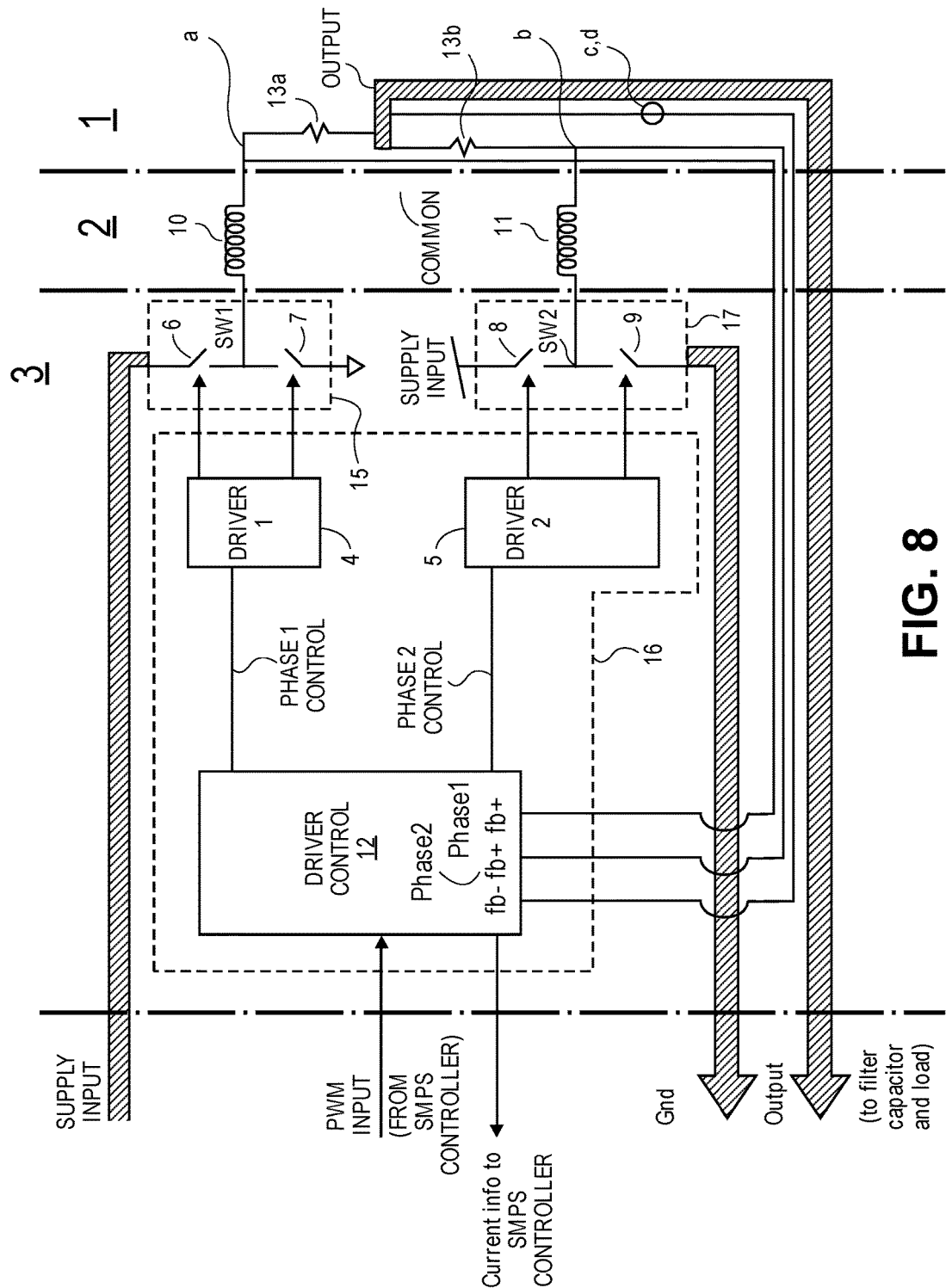
FIG. 8 is a circuit schematic illustrating part of a multi-phase switching power converter that is similar to FIG. 1A except that output power is combined after, or "downstream" of, individual phase current sense elements.

FIG. 8 is a circuit schematic illustrating part of a multi-phase switching power converter that is similar to FIG. 1A except that output power from the multiple phases (here, phase 1 inductor 10 and phase 2 inductor 11) is combined at the output node, after or "downstream" of individual phase current sense elements 13a, 13b through which inductor current of the phase inductors 10, 11 flows, respectively. The circuit elements shown may be assembled into a single, module stack similar to the embodiments described above, including the lower module 3, the middle module 2 above the lower module 3, and the upper module 1 above the middle module 2. The lower module 3 has the same power stage control circuitry 16 that is configured to convert the PWM input signal into multiple phase driver control signals (here, two), and that has power stages 15, 17 that are to be controlled by the phase driver control signals, respectively, through their respective phase drivers 4, 5 (as described above in connection with FIG. 1A).

Figure 9:
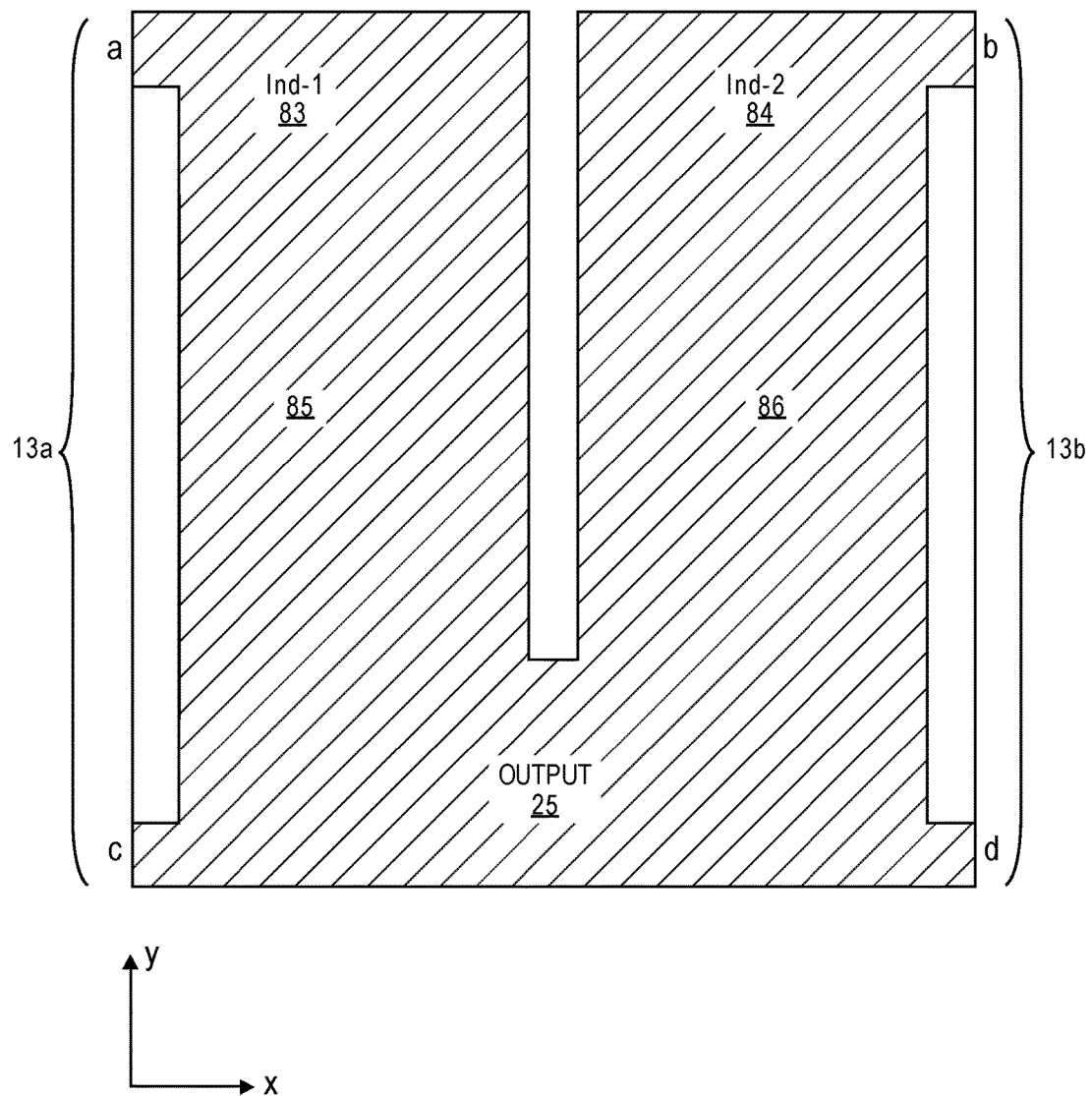
FIG. 9 depicts an example layout of some of the conductive nodes in the upper module of a module stack having the individual phase current sense arrangement of FIG. 8.

The upper module 1 of FIG. 8 is different than the one of FIG. 1A in that it contains multiple current sense resistors 13a, 13b, one in series with each phase inductor. FIG. 9 depicts an example layout of some of the conductive nodes in the upper module 1 of FIG. 8, where it can be seen that the current sense resistor 13a has a phase 1 current sense resistor body 85 whose one end is joined to an inductor 1 node upper portion 83, and another end joined to the output node upper portion 25 in the upper module 1. Similarly, the current sense resistor 13b has a phase 2 current sense resistor body 86 joined at one end to an inductor 2 node upper portion 82, and another end joined to the output node upper portion 25. The current sense resistors 13a, 13b may be designed to be identical as shown, so that the resistance across sense terminals a-c is intended to be the same as the resistance across sense terminals b-d.

Figure 10:
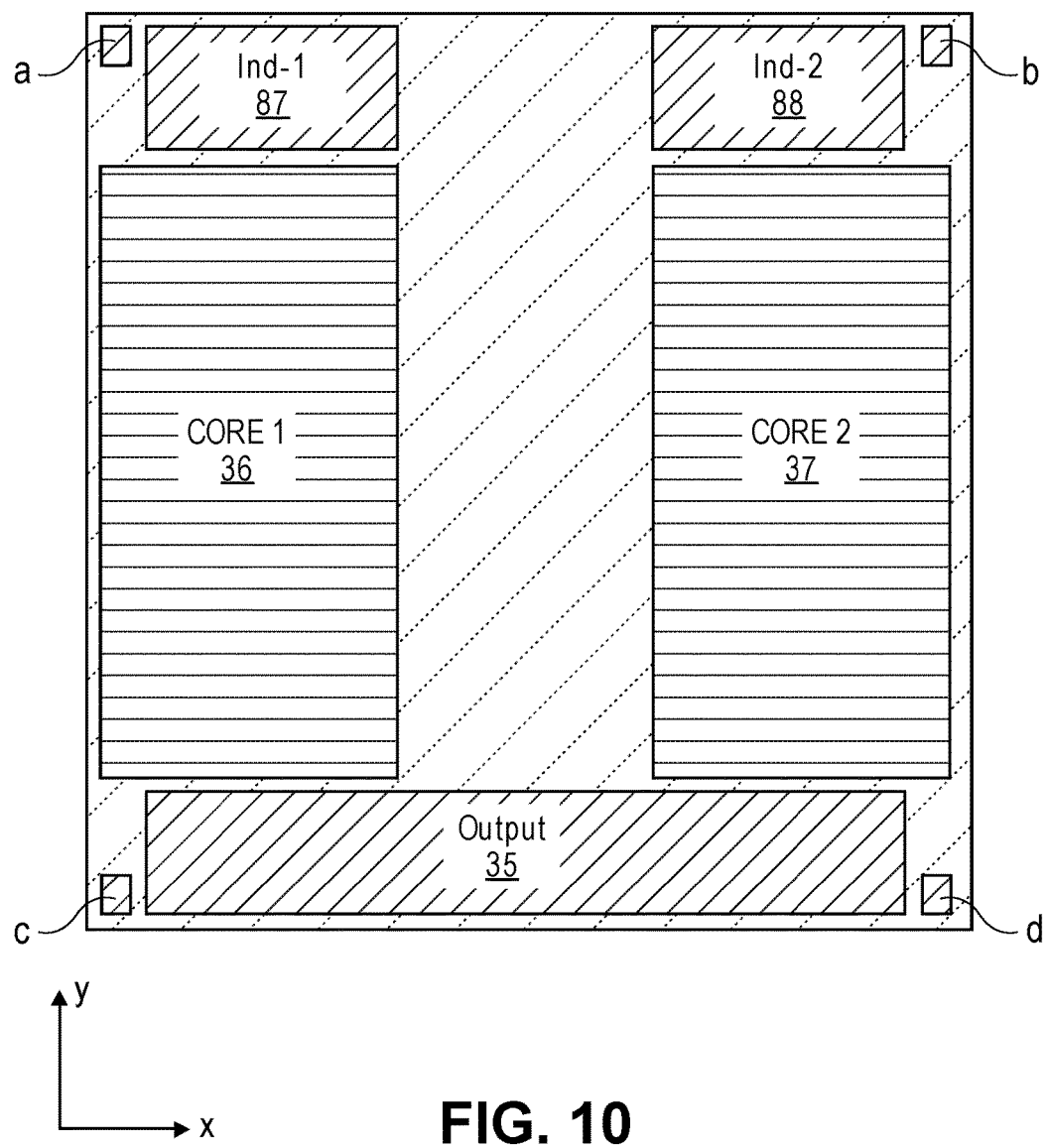
FIG. 10 depicts an example layout of some of the conductive portions at a top surface of the middle module, in the case of a module stack having only two phases and the individual phase current sense arrangement of FIG. 8.

FIG. 10 depicts an example layout of some of the conductive portions at a top surface of the middle module 2, in the case of a module stack having only two phases and the individual phase current sense arrangement of FIG. 8. The embodiment of FIG. 10 is similar to the one in FIG. 3 except as follows: instead of the common node lower portion 34 (which is joined to the common node further lower portion 44 and both of the winding1 and winding2 below it—see FIG. 4), there is an inductor 1 node lower portion 87 and a separate (electrically isolated), inductor 2 node lower portion 88. These lower portions 87, 88 are joined to the upper portions 83, 84, respectively, in the upper module 1 (see FIG. 9), through vertical conductive paths formed for example in a multi-layer laminate structure.

Figure 11:
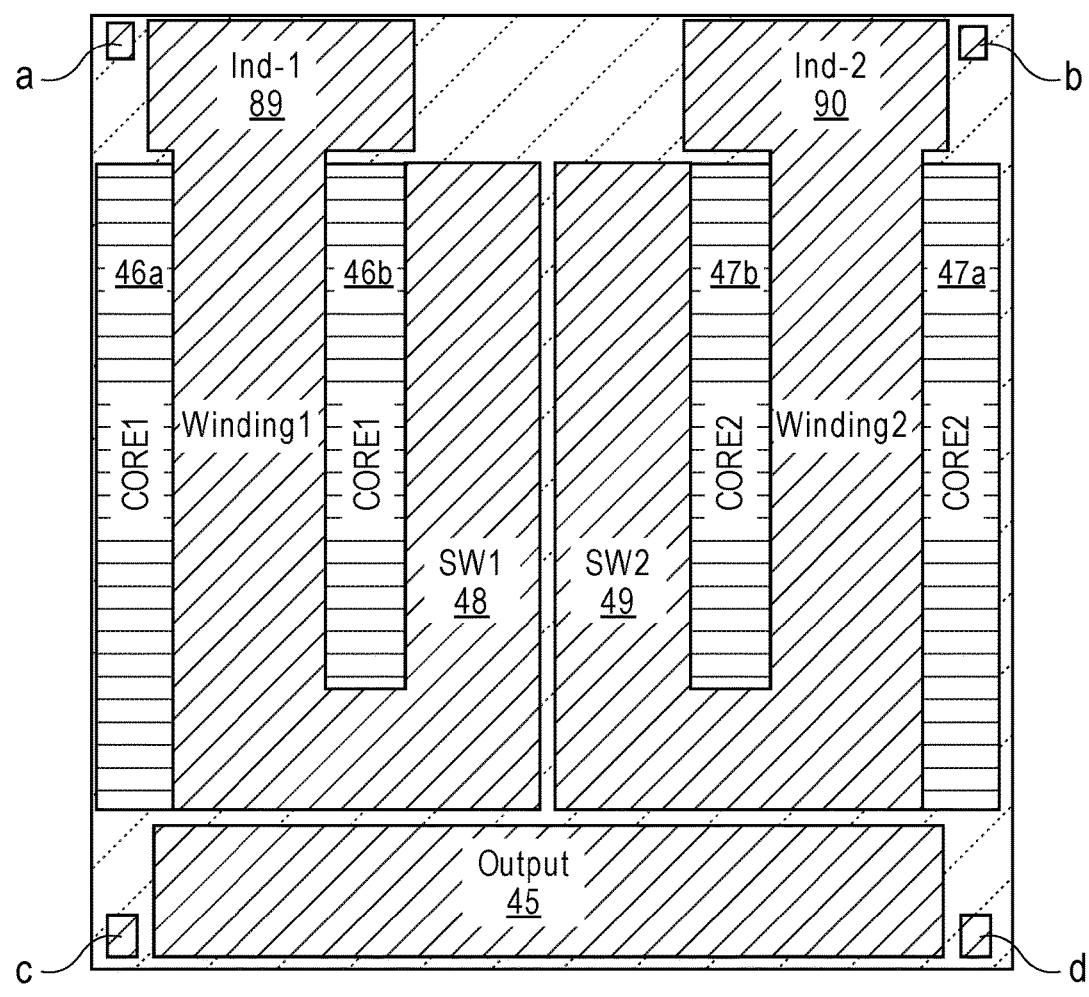
FIG. 11 depicts an example layout for the magnetic cores and windings of phase inductors in the two-phase middle module of FIG. 10.

FIG. 11 depicts an example layout for the magnetic cores and windings of the phase inductors in the two-phase, middle module 2 of FIG. 10. The layout is similar to what is shown in FIG. 4 except as follows: the common node further middle portion 44 is replaced with inductor 1 node further lower portion 89 and inductor 2 node further lower portion 90, wherein winding1 has one end joined to the node sw1 portion 48 (which joins the power stage 15 in the lower module), and another end joined to the inductor 1 node further lower portion 89. Similarly, winding2 has one end joined to the node sw2 portion 49, which joins the power stage 17 in the lower module 3, and another end joined to the inductor 2 node further lower portion 90.

The embodiment of FIGS. 8-11 is similar in layout and functionality to that of FIGS. 1A-7 except for the individual phase current sensing (through the phase current sense resistors 13a, 13b) being made available to the driver control circuitry 12. Here, the phase driver input signals are produced based on at least three, feedback voltage signals at the three inputs, fb−, phase 2 fb+ and phase 1 fb+, to balance currents in the phase inductors. These feedback voltage signals are routed through a number of conductive paths, respectively, that include: a first path (labeled a in FIGS. 9-11) that joins the inductor 1 node upper portion 83 in the upper module 1 and extends downward through the middle module 2 and into the lower module 3 where it joins the power stage control circuitry 16 (see FIG. 8); a second path (labeled b in FIGS. 9-11) that joins the inductor 2 node upper portion 84 in the upper module and extends downward through the middle module 2 and into the lower module 3 where it joins the power stage control circuitry 16; and a third path (labeled c in FIGS. 9-11) that joins the output node upper portion 25 in the upper module and extends downward through the middle module 2 and into the lower module 3 where it joins the power stage control circuitry 16.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, while a single high side supply input may be shared by the two phases as shown in FIG. 1A, the two phases may alternatively be coupled to different high side supply inputs (having different voltages). Also, the phase 1 inductor 10 and the phase 2 inductor 11 may be designed or specified to have the same inductance, or they may be designed to have different inductances. The description is thus to be regarded as illustrative instead of limiting.

What is claimed is:

1. A multi-phase switching power converter, comprising:
   a module stack including a lower module, a middle module above the lower module, and an upper module above the middle module,
   the lower module having power stage control circuitry configured to convert a pulse width modulated (PWM) input signal into a plurality of phase driver control signals and a plurality of power stages to be controlled by each of the plurality of phase driver control signals, respectively, the middle module having a plurality of phase inductors each having a respective winding and a respective magnetic core, wherein the respective winding of each of the plurality of phase inductors has one end joined to a respective one of the power stages in the lower module and another end joined to a common node in the middle module, and the upper module having a current sense resistor that has one end joined to the common node in the middle module and another end joined to an output node in the upper module.

2. The multi-phase switching power converter of claim 1, wherein the power stage control circuitry is configured to generate the plurality of phase driver input signals based on a plurality of feedback voltage signals to balance currents in the phase inductors.

3. The multi-phase switching power converter of claim 2, wherein each of the plurality of feedback voltage signals is routed through each of a plurality of conductive paths, respectively, that are joined to the common node in the middle module and to the output node in the upper module and that extend downward through the middle module and into the lower module, where they join the power stage control circuitry.

4. The multi-phase switching power converter of claim 1, wherein the middle module comprises a printed circuit board in which the respective magnetic core of each of the plurality of phase inductors is formed as embedded magnetics.

5. The multi-phase switching power converter of claim 1, wherein the respective magnetic core of each of the plurality of phase inductors is a laminated magnetic core, and the respective winding is formed as metal laminations.

6. The multi-phase switching power converter of claim 1, wherein the respective magnetic core of each of the plurality of phase inductors is formed of nano-magnetic material.

7. The multi-phase switching power converter of claim 1, wherein the lower module comprises an integrated circuit surface mount package or chip carrier selected from the group consisting of a ball grid array, a line grid array, and a flat package, and whose external connections are exposed on a bottom surface of the lower module and are to be soldered to a printed circuit board.

8. The multi-phase switching power converter of claim 1, wherein the upper module has a single metal layer in which the current sense resistor is formed and above which there is no electronic circuitry.

9. The multi-phase switching power converter of claim 1, wherein the upper module and the middle module are joined to each other along an upper planar, patterned metal layer, and wherein the middle module and the lower module are joined to each other along a lower planar, patterned metal layer.

10. The multi-phase switching power converter of claim 1, wherein each of the lower module, the middle module, and the upper module comprises a metal laminate structure, wherein a metal path is defined in the laminate structures that joins and extends from the output node in the upper module, through the middle module, to an output portion formed in the lower module.

11. The multi-phase switching power converter of claim 10, wherein the lower module comprises an integrated circuit surface mount package, a chip carrier, or a printed circuit board (PCB) having a plurality of external electrical connections formed on the bottom surface of the lower module.

12. The multi-phase switching power converter of claim 11, in combination with:

a further PCB having a plurality of pads to which the external electrical connections of the lower module are soldered, and an output filter capacitor having a terminal that is soldered to a pad in the further PCB, wherein a metal trace in the further PCB joins the pad to one of the plurality of pads to which an external electrical connection of the lower module is soldered that is joined to the output portion in the lower module.

13. A multi-phase switching power converter, comprising:

a module stack that includes a lower module and an upper module, wherein the upper module is above the lower module and integrated therewith in the module stack, wherein the lower module has power stage control circuitry configured to convert a pulse width modulated (PWM) input signal into a plurality of phase driver signals and a plurality of power stages, coupled to a high side supply input and a low side return or ground, to be controlled by each of the plurality of phase driver signals, respectively, wherein the upper module has a plurality of phase inductors each having a respective winding and a respective magnetic core, wherein the respective winding of each of the phase inductors has one end joined to a respective one of the power stages in the lower module and another end joined to a common node in the upper module, and wherein the lower module comprises an integrated circuit surface mount package, chip carrier, or printed circuit board (PCB) having formed on a bottom surface of the lower module a plurality of external electrical connections that include:

a first group of external electrical connections that are joined to the high side supply input to deliver input power to the converter, a second group of external electrical connections that are joined to the low side return or ground in the lower module, and a third group of external electrical connections that are joined to the common node in the upper module to deliver output power from the converter.

14. The multi-phase switching power converter of claim 13, further comprising:

a further PCB having a plurality of pads to which the first, second, and third groups of the external electrical connections of the lower module are soldered; and an output filter capacitor having a terminal that is soldered to a pad in the further PCB that is joined, via a metal trace in the further PCB, to one of the plurality of pads to which an external electrical connection of the third group is soldered that is joined to the common node.

15. The multi-phase switching power converter of claim 14, further comprising:

a switch mode power supply (SMPS) controller mounted on the further PCB and configured to produce the PWM input signal, wherein the further PCB has a further metal trace therein to conduct the PWM input signal and join one of the plurality of external electrical connections of the lower module.

16. The multi-phase switching power converter of claim 13, wherein each of the lower module and the upper module comprises a multi-layer metal laminate structure, wherein a metal path is formed in the laminate structures that joins the common node in the upper module and extends downward to an output portion that is patterned in a metal layer at a bottom surface of the lower module.

17. The multi-phase switching power converter of claim 13, wherein the power stage control circuitry is configured to control the plurality of phase driver signals based on a plurality of feedback voltage signals, to balance currents in the plurality of phase inductors, wherein each of the plurality of feedback voltage signals is routed through each of a plurality of conductive paths, respectively, formed solely in the lower module and that join the power stages without extending into the upper module.

18. The multi-phase switching power converter of claim 13, wherein the upper module and the lower module are joined to each other along a planar, patterned metal layer, wherein the upper module is defined as being above the planar, patterned metal layer, and wherein the lower module is defined as being below the planar, patterned metal layer.

19. The multi-phase switching power converter of claim 13, wherein the power stage control circuitry is configured to convert the PWM input signal is into two phase driver signals, and wherein the plurality of power stages consists of first and second power stages controlled by each of the two phase driver signals, respectively.

20. A multi-phase switching power converter comprising:
   a module stack including a lower module, a middle module above the lower module, and an upper module above the middle module,
   the lower module having power stage control circuitry configured to convert a pulse width modulated (PWM) input signal into a plurality of phase driver control signals and a plurality of power stages to be controlled by each of the plurality of phase driver control signals, respectively,
   the middle module having a plurality of phase inductors each having a respective winding and a respective magnetic core, wherein the respective winding of each of the phase inductors has one end joined to a respective one of the power stages in the lower module and another end joined to a respective one of a plurality of inductor nodes in the middle module, and
   the upper module having a plurality of current sense resistors, each having one end joined to the respective one of the plurality of inductor nodes in the upper module and another end joined to an output node in the upper module.

21. The multi-phase switching power converter of claim 20, wherein the power stage control circuitry is configured to generate the plurality of phase driver input signals based on a plurality of feedback voltage signals to balance currents in the phase inductors.

22. The multi-phase switching power converter of claim 21, wherein each of the plurality of feedback voltage signals is routed through each of a plurality of conductive paths, respectively, that include:
   a first path that joins a first one of a plurality of inductor node upper portions in the upper module and extends downward through the middle module and into the lower module, where it joins a feedback input of the power stage control circuitry;
   a second path that joins a second one of the plurality of inductor node upper portions in the upper module and extends downward through the middle module and into the lower module, where it joins another feedback input of the power stage control circuitry; and
   a third path that joins the output node in the upper module and extends downward through the middle module and into the lower module, where it joins a further feedback input of the power stage control circuitry.

23. The multi-phase switching power converter of claim 22, wherein, in the upper module, each of the plurality of current sense resistors comprises a respective phase current sense resistor body that, at one end, is joined to and extends from a respective one of a plurality of inductor node upper portions in the upper module to another end that is joined to the output node in the upper module.

\* \* \* \* \*